United States Patent
Kelty

(10) Patent No.: US 10,091,911 B2
(45) Date of Patent: Oct. 2, 2018

(54) INTERFACE CARD COOLING USING HEAT PIPES

(71) Applicant: Infinera Corporation, Sunnyvale, CA (US)

(72) Inventor: Matthew J. Kelty, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 327 days.

(21) Appl. No.: 13/711,052

(22) Filed: Dec. 11, 2012

(65) Prior Publication Data

US 2014/0160679 A1 Jun. 12, 2014

(51) Int. Cl.
*H05K 7/20* (2006.01)

(52) U.S. Cl.
CPC ............................ *H05K 7/20672* (2013.01)

(58) Field of Classification Search
CPC .......... H05K 7/20; G06F 1/203–1/206; G06F 2200/201–2200/203; G06F 220/201–220/203
USPC .................... 361/649, 679.52, 700, 715, 748
See application file for complete search history.

(56) References Cited

U.S. PATENT DOCUMENTS

| | | | | |
|---|---|---|---|---|
| 5,036,428 A * | 7/1991 | Brownhill | ............ | H05K 7/1404 165/80.1 |
| 6,811,326 B2 * | 11/2004 | Keeble | ................. | G02B 6/4201 385/92 |
| 6,816,376 B2 * | 11/2004 | Bright | .................. | G02B 6/4201 165/185 |
| 6,916,122 B2 * | 7/2005 | Branch | ................ | G02B 6/4201 257/675 |
| 7,317,617 B2 * | 1/2008 | Meadowcroft | ...... | G02B 6/4201 165/104.33 |
| 7,371,965 B2 * | 5/2008 | Ice | ........................ | G02B 6/4201 174/50 |
| 7,394,654 B2 * | 7/2008 | Zieman | ..................... | G06F 1/20 312/236 |
| 7,529,094 B2 * | 5/2009 | Miller | .................. | G02B 6/4246 165/185 |
| 7,764,504 B2 * | 7/2010 | Phillips | ................ | G02B 6/4246 165/80.2 |
| 7,839,643 B1 * | 11/2010 | Yu | ................................. | 361/715 |
| 8,274,787 B2 * | 9/2012 | Alyaser et al. | .......... | 361/679.53 |
| 8,345,445 B2 * | 1/2013 | Del Prete | .................. | G06F 1/20 165/185 |
| 8,448,331 B2 * | 5/2013 | Baba | .............................. | 29/743 |
| 8,537,550 B2 * | 9/2013 | Higuchi et al. | ............... | 361/699 |
| 8,649,180 B2 * | 2/2014 | Grady | ..................... | G06F 1/183 361/725 |

(Continued)

*Primary Examiner* — Courtney Smith
(74) *Attorney, Agent, or Firm* — David L. Soltz

(57) ABSTRACT

A device may have: a frame section having a cage with a first receiving portion and a second receiving portion, the second receiving portion receiving a module; a first plate having an end, the first plate being received by the first receiving portion; a heat pipe having a first end attached to the end of the first plate and having a second end; a second plate attached to the second end of the heat pipe; and a spring attached to the first plate to bias the first plate against the module, the first plate being capable of receiving heat dissipated by the module, the heat pipe being capable of receiving the heat received by the first plate and transferring the heat to the second plate, the second plate receiving the heat transferred by the heat pipe and dissipating the received heat.

20 Claims, 6 Drawing Sheets

(56) References Cited

U.S. PATENT DOCUMENTS

| | | | | |
|---|---|---|---|---|
| 8,879,267 | B2* | 11/2014 | Henry et al. | 361/715 |
| 8,913,391 | B2* | 12/2014 | Ling | H05K 7/20545 |
| | | | | 165/185 |
| 2002/0028552 | A1* | 3/2002 | Lee et al. | 438/243 |
| 2005/0152663 | A1* | 7/2005 | Bench et al. | 385/147 |
| 2005/0195565 | A1* | 9/2005 | Bright | 361/688 |
| 2006/0291171 | A1* | 12/2006 | Ahrens | G02B 6/4292 |
| | | | | 361/716 |
| 2007/0058347 | A1* | 3/2007 | Tsai et al. | 361/703 |
| 2011/0198057 | A1* | 8/2011 | Lange et al. | 165/104.26 |
| 2014/0251577 | A1* | 9/2014 | Connors | 165/67 |

* cited by examiner

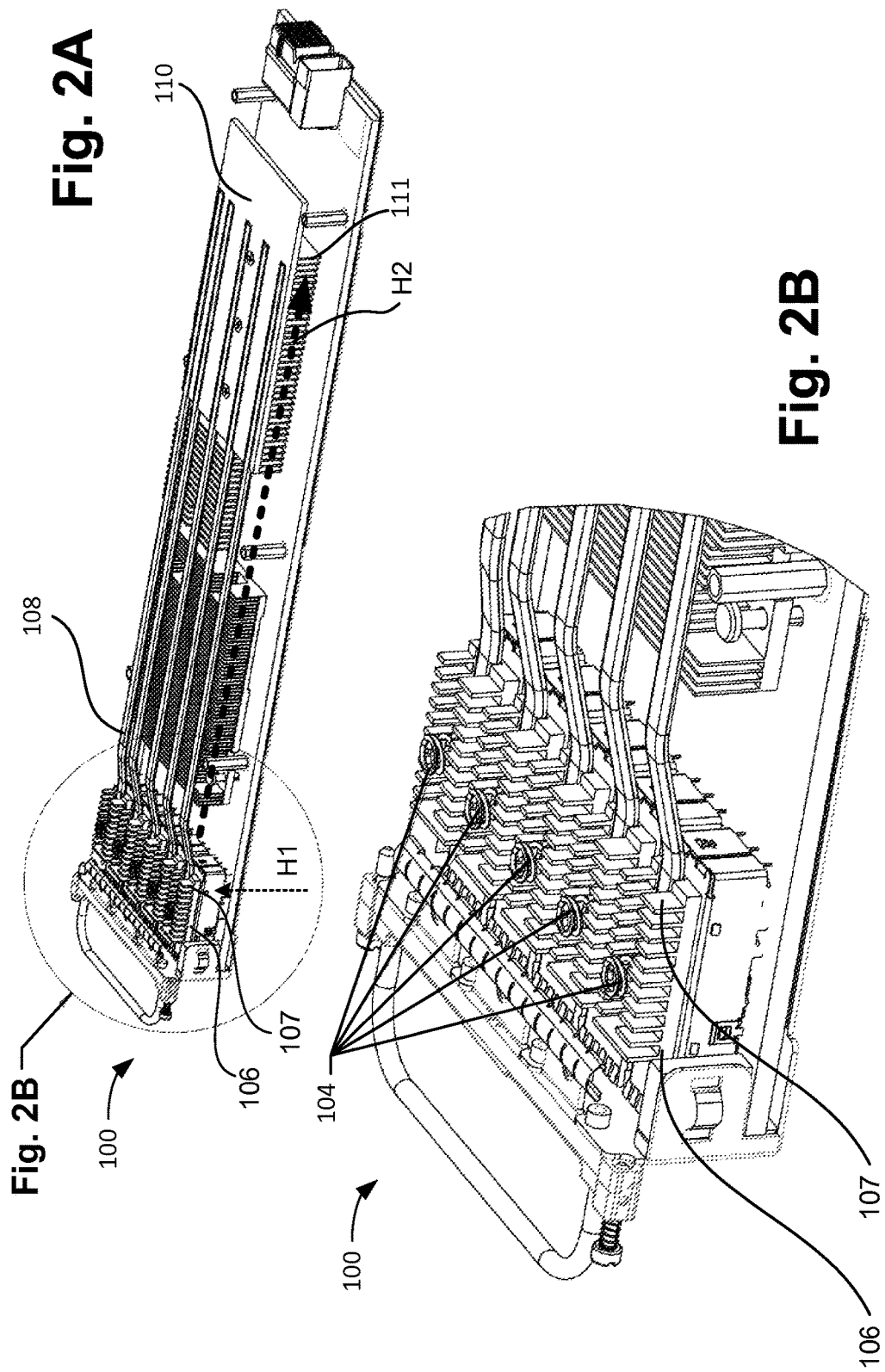

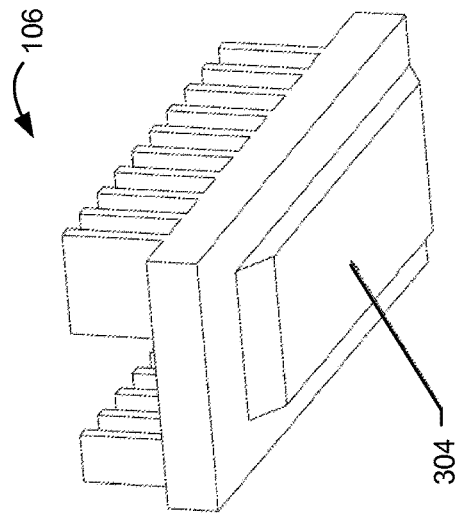
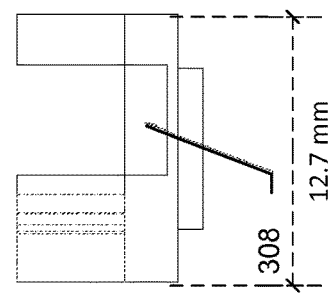
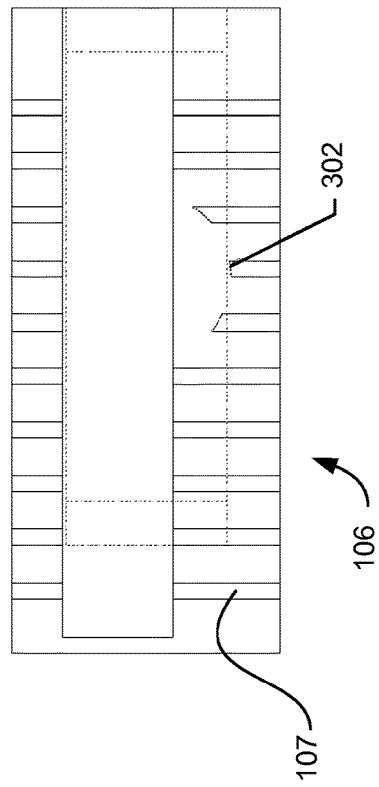
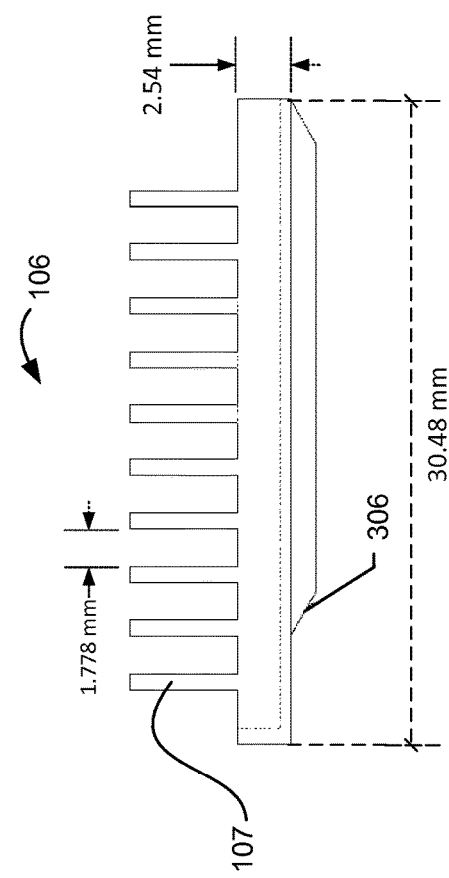

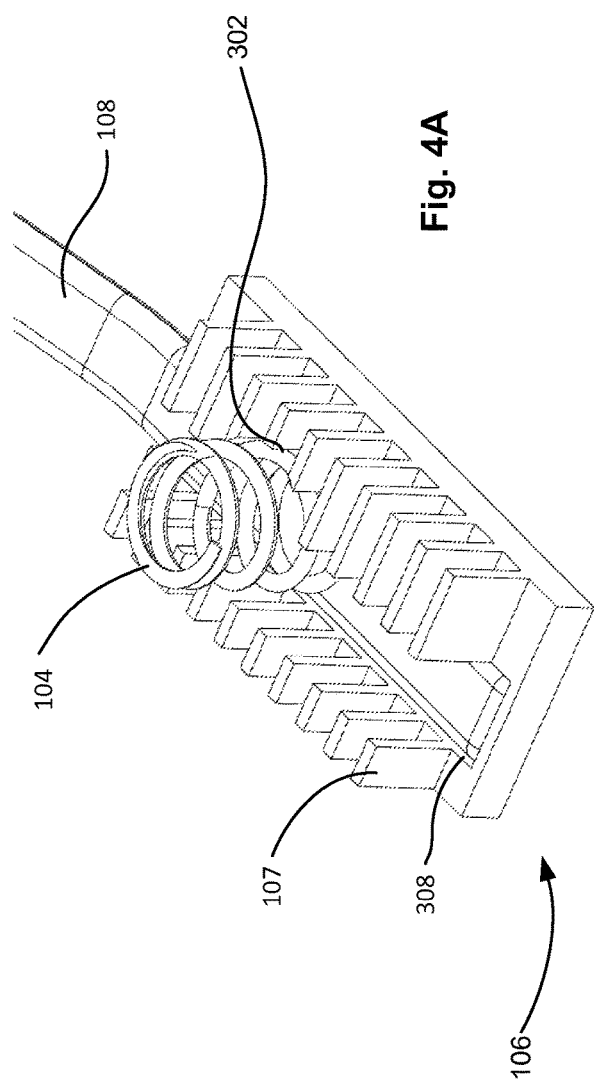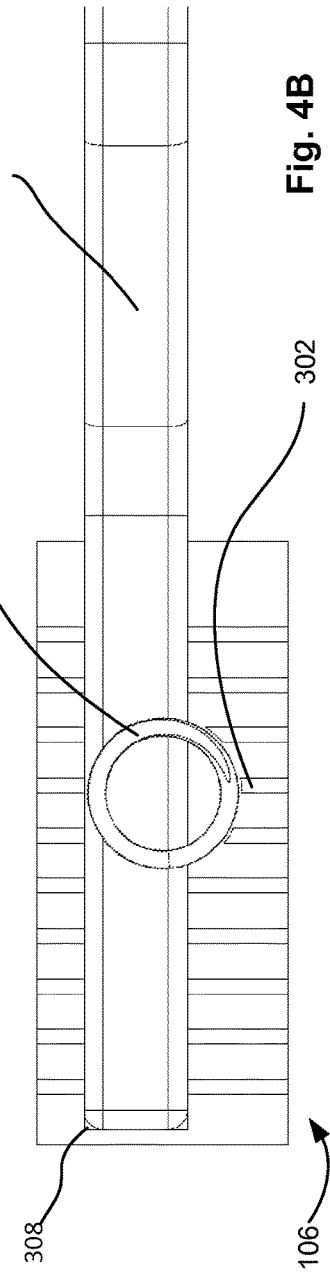

INTERFACE CARD COOLING USING HEAT PIPES

BACKGROUND

A small form-factor pluggable (SFP) module is a transceiver used for telecommunication and data communication applications. An SFP module interfaces with an interface card, such as a circuit board for a network device (e.g., a switch, router, media converter, or similar device) to a fiber optic or copper networking cable. An SFP module dissipates heat during normal operation and may include a heat sink attached to the SFP module to reduce the dissipated heat. Multiple SFP modules are sometimes placed adjacent to each other and parallel to airflow, thereby causing a preheating effect when corresponding heat sinks, attached to each SFP module, dissipate heat in a confined location and over a confined area. Further, an individual heat sink for an SFP module may be unreliable and may be susceptible to separation from the SFP module during assembly of the SFP module and during installation of the SFP module in an interface card. Additionally, manufacturing an SFP module with an attached heat sink is often a labor intensive and costly process.

SUMMARY OF THE INVENTION

According to one example implementation, a device may have a frame section having a cage with a first receiving portion and a second receiving portion. The second receiving portion may receive a module. The device may also have a first plate having an end, the first plate being received by the first receiving portion to attach the first plate to the frame section; a heat pipe having a first end attached to the end of the first plate and having a second end; a second plate attached to the second end of the heat pipe; a cover attaching the first plate, the heat pipe, and the second plate to the frame section; and a spring attached to the first plate and disposed between the first plate and the cover to bias the first plate against the module. The first plate may receive heat dissipated by the module. The heat pipe may receive the heat received by the first plate and transfer the heat to the second plate. The second plate may receive the heat transferred by the heat pipe and dissipate the received heat.

According to another example implementation, a device may have an interface card having a frame section having a cage with a first receiving portion and a second receiving portion. The second receiving portion may receive a module. The device may also have a first plate having an end, the first plate being received by the first receiving portion to attach the first plate to the frame section; a heat pipe having a first end attached to the end of the first plate and having a second end; a second plate attached to the second end of the heat pipe; and a spring attached to the first plate to bias the first plate against the module. The first plate may receive heat dissipated by the module. The heat pipe may receive the heat received by the first plate and transfer the heat to the second plate. The second plate may receive the heat transferred by the heat pipe and dissipate the received heat.

According to another example implementation, a device may have an interface card having a frame section having a cage with a first receiving portion and a second receiving portion. The second receiving portion may receive a module. The device may also have a first plate having an end, the first plate being received by the first receiving portion to attach the first plate to the frame section; a flexible heat pipe having a first end attached to the end of the first plate and having a second end; a second plate attached to the second end of the flexible heat pipe; and a spring attached to the first plate to bias the first plate against the module. The first plate may receive heat dissipated by the module. The flexible heat pipe may receive the heat received by the first plate and transfer the heat to the second plate. The second plate may receive the heat transferred by the flexible heat pipe and dissipate the received heat.

BRIEF DESCRIPTION OF THE DRAWINGS

FIGS. 2A-2B illustrate isometric views of an interface card;

FIGS. 3A-3D illustrate details of a cold plate;

FIGS. 4A-4B illustrate details of a cold plate with a heat pipe and spring attached to the cold plate;

DETAILED DESCRIPTION

The following detailed description refers to the accompanying drawings. The same reference numbers in different drawings may identify the same or similar elements.

Systems and/or methods, as described herein, may cool of an interface card having multiple SFP modules installed in the interface card adjacent to each other. In some implementations, the systems and/or methods may prevent a preheating effect from arising when multiple SFP modules are installed adjacent to each other. For example, the systems and/or methods may utilize a heat pipe to receive heat dissipated by an SFP module and transfer the dissipated heat to a substantially remote location from where the heat was dissipated. In some implementations, the dissipated heat may be dissipated, a second time, over a larger area in relation to when heat is dissipated via individual heat sinks attached to individual SFP modules.

While the systems and/or methods are described in terms of providing an interface card having multiple SFP modules installed adjacent to each other, in practice, the systems and/or methods are not so limited. For example, the systems and/or methods may be applied to any device susceptible to the preheating effect and may apply to other types of modules, including or excluding SFP modules, such as SFP enhance (SFP+) modules, Centum form-factor pluggable (CFP) modules, CFP2 modules, XENPACK form-factor pluggable (XFP) modules, or some other type of module.

Figure 1:
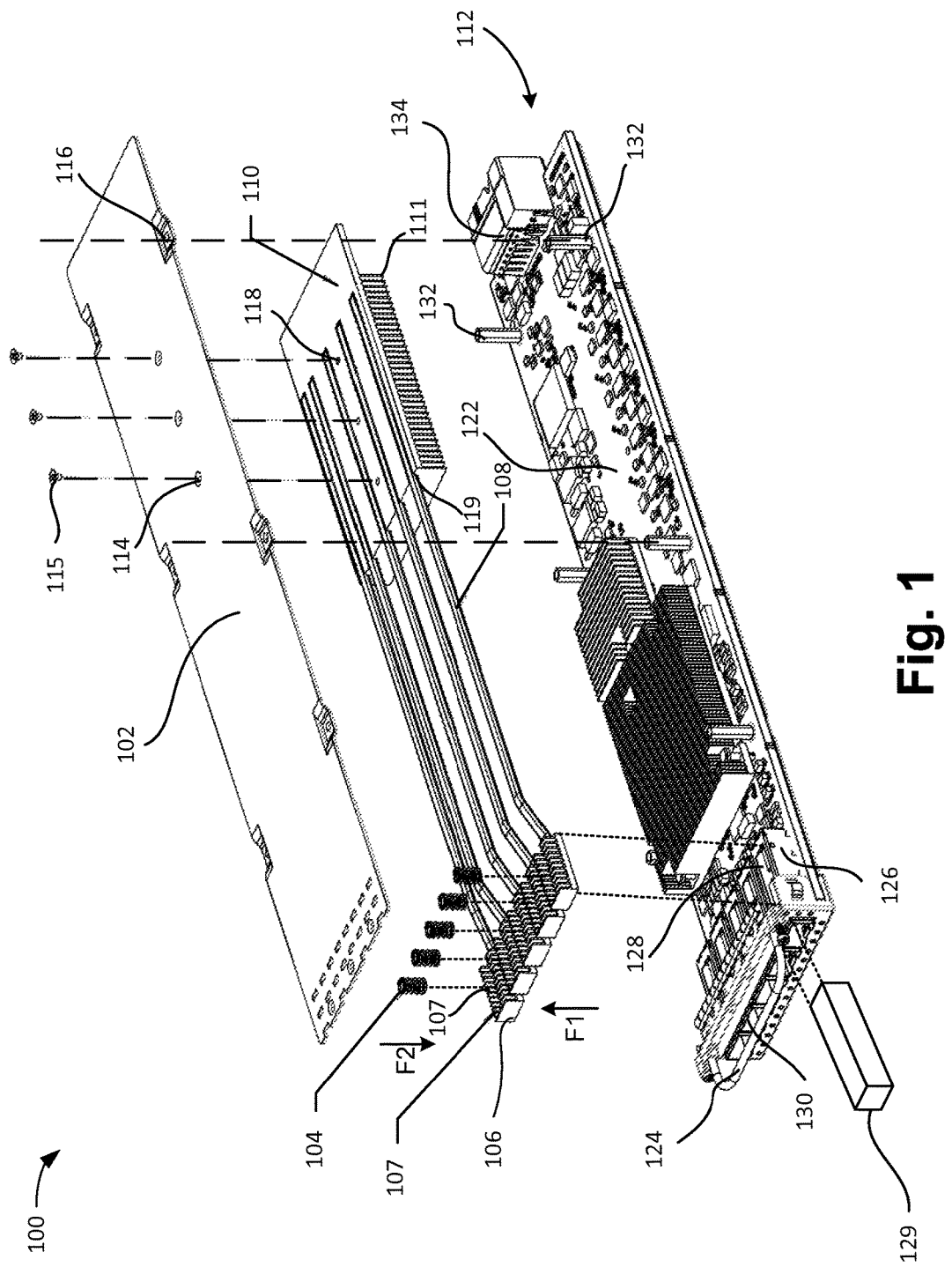
FIG. 1 illustrates an overview of an interface card as described herein.

FIG. 1 illustrates an overview of an interface card as described herein. In some implementations, interface card 100 may receive a module, such as SFP module 129, and may transmit data received by SFP module 129 to a connected device (e.g., a switch transport network chassis, an optical transport network tributary module, etc.) via connector 134. In some implementations SFP module 129 may dissipate heat during normal operation. Interface card 100 may include components to dissipate the heat, associated with SFP module 129, in a manner that prevents a preheating effect from arising when multiple SFP modules 129 are installed adjacent to each other. For example, interface card 100 may include cover 102, a first plate (e.g., cold plate 106), heat pipes 108, a second plate (e.g., dissipating plate 110), and frame section 112.

As shown in FIG. 1, frame section 112 may include base 122, handle 124, cage 126, top receiving portion 128, front receiving portion 130, ribs 132, and connector 134. Base 122 may be a printed circuit board (PCB) and may include processors, modules, heat sinks, and/or other components associated with transmitting signals received by SFP module 129 to a connected device via connector 134.

Handle 124 may be disposed at a distal end of frame section 112 and to permit a user of interface card 100 to carry interface card 100 and to aid installation of interface card 100 to a connecting device.

Cage 126 may include a recess having two portions, such as a first receiving portion (e.g., top receiving portion 128) and a second receiving portion (e.g., front receiving portion 130). In some implementations, cage 126 may receive cold plate 106, via top receiving portion 128, to confine cold plate 106 in place and to attach cold plate 106 to frame section 112. As further shown in FIG. 1, heat pipe 108 may attach to cold plate 106 and dissipating plate 110 may attach to heat pipe 108. Thus, cold plate 106, heat pipe 108, and dissipating plate 110 may attach to frame section 112 when cold plate 106 is received by top receiving portion 128.

As further shown in FIG. 1, cover 102 may attach to frame section 112 and to dissipating plate 110 to confine cold plate 106, heat pipe 108, and dissipating plate 110 to frame section 112. For example, cover 102 may include recesses 114 to receive fasteners 115 to attach cover 102 to dissipating plate 110 via recess 118. In some implementations, cover 102 may be made from an aluminum sheet metal, or some other material. Cover 102 may include recesses 116 to attach cover 102 to frame section 112 via ribs 132. In some implementations, cover 102 may be provided to protect components of interface card 100.

In some implementations, cage 126 may receive SFP module 129 via front receiving portion 130 (e.g., as part of an installation of SFP module 129 into interface card 100). When SFP module 129 is installed in interface card 100, SFP module 129 contacts cold plate 106 and applies force F1 to a bottom portion of cold plate 106 to engage cold plate 106 to allow cold plate 106 to receive heat dissipated by SFP module 129. For example, cold plate 106 may include a thermal conductive material, such as aluminum or copper, to receive heat dissipated by SFP module 129. Springs 104 may be attached to cold plate 106 via fins 107 to provide a biasing force (e.g., force F2), to engage cold plate 106 with SFP module 129 such that cold plate 106 may receive heat dissipated by SFP module 129. The biasing force provided by springs 104 is described below with respect to FIG. 5B. In some implementations, springs 104 may include a coil spring, a torsion spring, a spring clip, or some other type of spring.

As further shown in FIG. 1, cold plate 106 may include fins 107 to dissipate heat received by SFP module 129. Heat pipe 108 may be attached to a distal end of cold plate 106 to receive heat received by cold plate 106 (e.g., heat associated with SFP module 129), and may connect with dissipating plate 110 via groove 119 to transfer the heat to dissipating plate 110. For example, heat pipe 108 may include a thermal conductive material, such as aluminum or copper, thereby allowing heat pipe 108 to transfer heat from a received location (e.g., from cold plate 106) to a desired location (e.g., dissipating plate 110). Alternatively, heat pipe 108 may include a hollow pressurized tube containing an air/water mixture such that the water boils at a location where heat pipe 108 attaches to cold plate 106 and the water condenses at a location where heat pipe 108 attaches to dissipating plate 110. Dissipating plate 110 may include fins 111 to dissipate heat at a location substantially remote from heat dissipated by SFP module 129 thereby preventing the preheating effect.

While a particular arrangement of components is shown with respect to interface card 100, in practice, interface card 100 may include additional, fewer, or differently arranged components that what is shown in FIG. 1. Further, interface card 100 may include components to receive any number of SFP modules 129 and cold plates 106. For example, interface card 100 may include multiple cages 126 to receive multiple cold plates 106 and multiple SFP modules 129.

FIGS. 2A-2B illustrate isometric views of interface card 100. For clarity, cover 102 is not shown in FIGS. 2A-2B. In FIG. 2A, assume that SFP module 129 is installed in interface card 100 and that SFP module 129 dissipates heat in the direction of H1. As described above, cold plate 106 may receive the heat and dissipate a portion of the heat via fins 107. Additionally, heat pipe 108 may receive a portion of the heat and transfer the portion of the heat in the direction of H2. As described above, dissipating plate 110 may receive the portion of the heat transferred by heat pipe 108 and dissipate the transferred heat via fins 111. In some implementations, and as shown in FIG. 2B, springs 104 may be attached to cold plates 106 via fins 107.

FIGS. 3A-3D illustrate details of cold plate 106. FIG. 3A illustrates a top view of cold plate 106. As shown in FIG. 3A, fins 107 may include cutout section 302 to receive spring 104 and confine spring 104 in place.

FIG. 3B illustrates an isometric view of cold plate 106. As shown in FIG. 3B, cold plate 106 may include protrusion 304 on a bottom portion of cold plate 106. In some implementations, protrusion 304 contacts SFP module 129 when SFP module 129 is installed in interface card 100 to engage SFP module 129 with cold plate 106. Protrusion 304 may include a thermal conductive material, such as aluminum, copper, silver, or some other thermal conductive material, to receive heat dissipated by SFP module 129.

FIG. 3C illustrates a side view of cold plate 106. As shown in FIG. 3C, cold plate 106 may include chamfer 306 to aid in installation of SFP module 129 into interface card 100. For example, chamfer 306 may include an inclined surface to allow for smooth insertion of SFP module 129 into interface card 100. As shown in FIG. 3C, cold plate 106 may include a width of approximately 30.48 millimeters (mm) and a height of approximately 2.54 millimeters. As further shown in FIG. 3C, fins 107 may be provided approximately 1.778 mm apart on cold plate 106.

FIG. 3D illustrates a front view of cold plate 106. As shown in FIG. 3D, cold plate 106 may include groove 308 to receive and confine heat pipe 108 to cold plate 106. As further shown in FIG. 3D, cold plate 106 may include a depth of approximately 12.7 mm.

While a particular design of cold plate 106 is shown in FIGS. 3A-3D, in practice, cold plate 106 may have a different design, shape, dimensions, or size than what is shown in FIGS. 3A-3D.

FIGS. 4A-4B illustrate details of cold plate 106 with heat pipe 108 and spring 104 attached to cold plate 106. FIGS. 4A-4B illustrate spring 104 and heat pipe 108 attached to cold plate 106. FIG. 4A illustrates an isometric view of cold plate 106 with spring 104 and heat pipe 108 attached to cold plate 106. As shown in FIG. 4A, cold plate 106 may receive heat pipe 108 via groove 308. Additionally, cold plate 106 may receive spring 104 via cutout section 302. As shown in FIG. 4A, cutout section 302 may confine spring 104 to cold plate 106. FIG. 4B illustrates a top view of cold plate 106 with spring 104 and heat pipe 108 attached to cold plate 106 as described above.

Figure 5A:
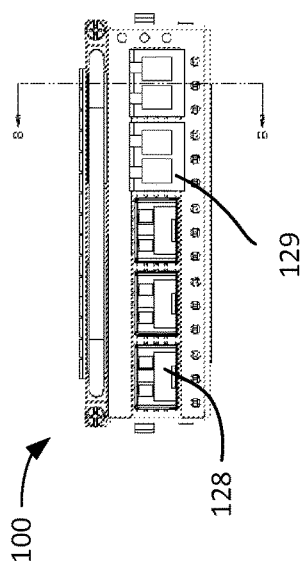
FIGS. 5A-5B illustrate an example implementation as described herein.
Figure 5B:
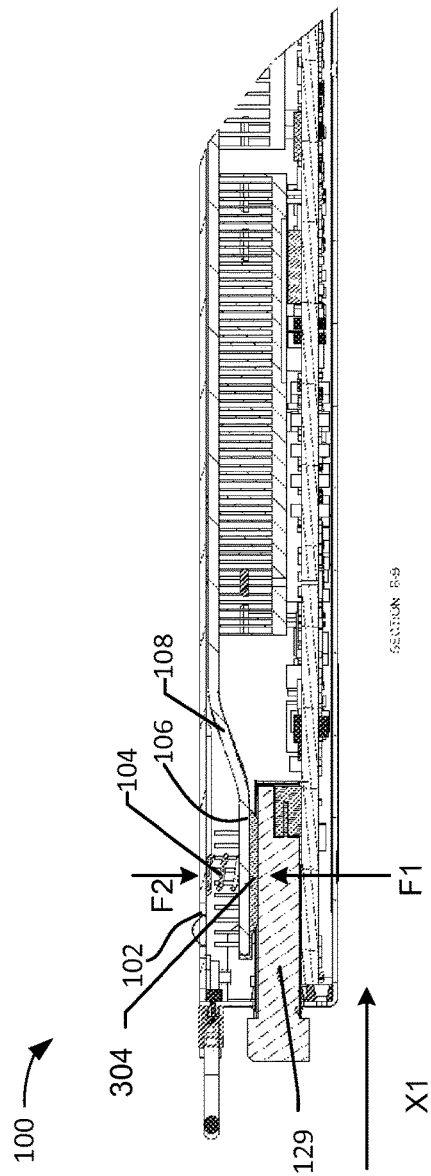

FIGS. 5A-5B illustrate an example implementation as described herein. FIG. 5A illustrates a front view of interface card 100. As shown in FIG. 5A, top receiving portion 128 may receive SFP module 129 or may remain vacant. Continuing to FIG. 5B, (e.g., cross section B-B of FIG. 5A), assume that SFP module 129 is installed in interface card 100 via top receiving portion 128 by inserting SFP module 129 into top receiving portion 128 in the X1 direction. As shown in FIG. 5B, and described above, SFP module 129 contacts cold plate 106 via protrusion 304 and applies force F1 to cold plate 106. As further shown in FIG. 5B, spring 104 may be disposed between cold plate 106 and cover 102 to apply biasing force F2 against a top portion of cold plate 106 such that cold plate 106 engages SFP module 129. As a result of force F1, heat pipe 108 incurs a deflection to compensate for force F1. Thus, heat pipe 108 may be made from a flexible material to allow cold plate 106 to be displaced in the direction of force F1. As described above, cold plate 106 may receive heat dissipated by SFP module 129 when cold plate 106 engages SFP module 129 as a result of biasing force F2. Further, heat pipe 108 may transfer heat to dissipating plate 110 (e.g., as shown in FIG. 1) to allow dissipating plate 110 to dissipate the received heat via fins 111.

Figure 6:
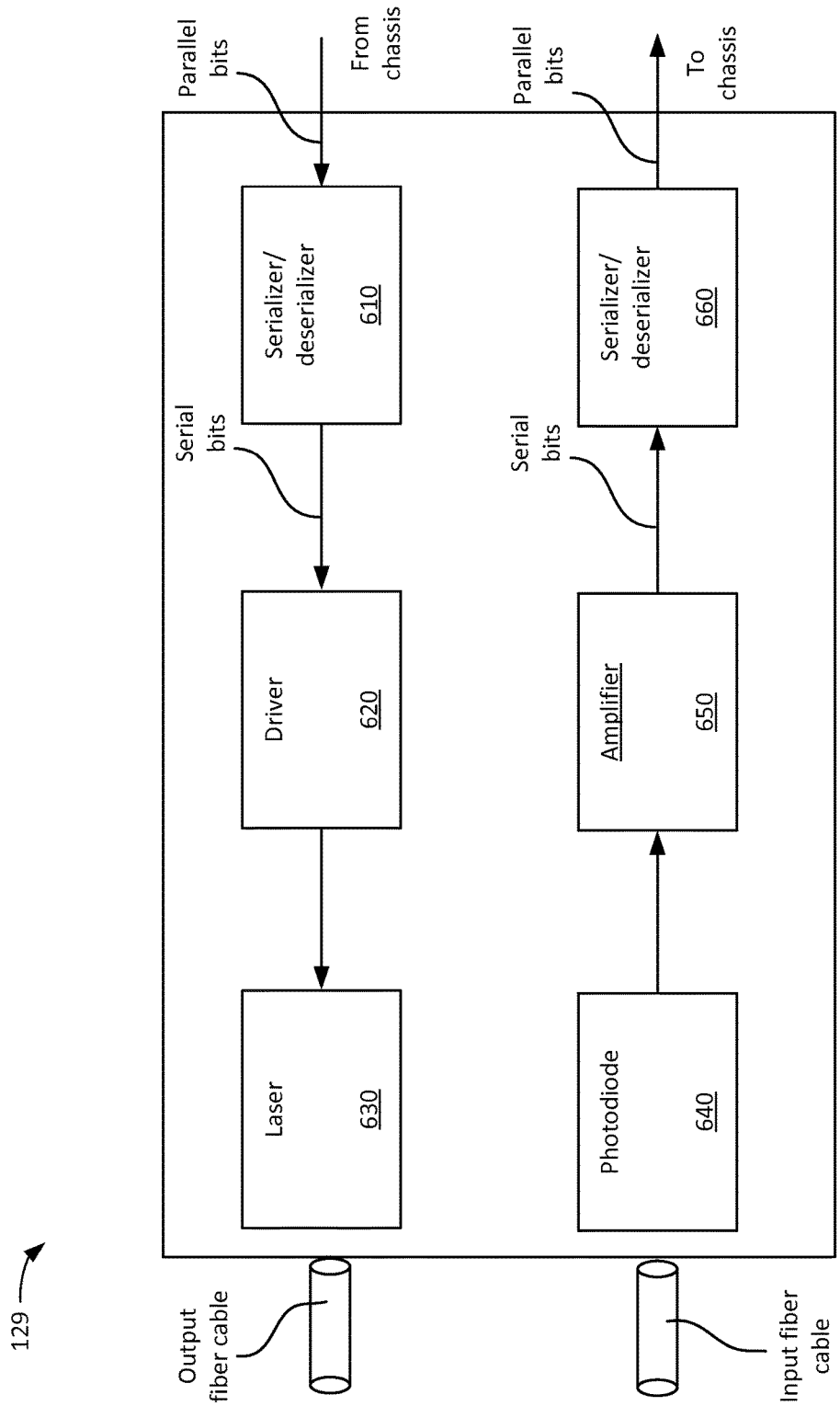
FIG. 6 illustrates a block diagram of example components of a module.

FIG. 6 illustrates a block diagram of example components of SFP module 129. As shown in FIG. 6, SFP module 129 may include serializer/deserializer 610, driver 620, laser 630, photodiodes 640, amplifier 650 and serializer/deserializer 660. In some implementations, SFP module 129 may be a transceiver module including a transmit portion and a receiving portion. The transmit portion may include serializer/deserializer 610, driver 620, and laser 630 to output optical signals. The receiving portion may include photodiodes 640, amplifier 650, and serializer/deserializer 660 to receive optical signals and convert the received optical signals to electrical signals.

In some implementations, serializer/deserializer 610 may receive electrical signals in the form of parallel bit streams from circuitry housed in a chassis (e.g., an XTN chassis) via a tributary interface module (TIM). Additionally, or alternatively, serializer/deserializer 610 may receive electrical signals in some other form from some other source. Serializer/deserializer 610 may convert the received parallel bit streams into a serial bit stream that is received by driver 620. Driver 620 may output a voltage and/or current to drive or power laser 630. Laser 630 may supply (e.g., to an output fiber cable) a modulated optical output that is indicative of information included in the bit streams.

In some implementations, photodiodes 640 may receive optical signals (e.g., from an input fiber cable) and may generate electrical signals corresponding to the received optical signals. Amplifier 650 may receive the electrical signals provided by photodiodes 640 and may adjust the voltage of the electrical signals. Amplifier 650 may also shape the electrical signals to resemble a train of pulses or a serial bit stream. The pulses are may be provided to serializer/deserializer 660. Serializer/deserializer 660 may provide a bit stream to multiple parallel outputs. The outputs of serializer/deserializer 660 may be provided to circuitry in the chassis via the TIM.

As described above, SFP module 129 may include some other type of module other than an SFP module. Thus, serializer/deserializer 610, driver 620, laser 630, photodiodes 640, amplifier 650 and serializer/deserializer 660 may be included in some other type of module. Also, the operations and/or data flows may be modified from what is described above. Further, non-dependent operations and/or data flows may be performed in parallel.

As described above, interface card 100 may include components to prevent the preheating effect from arising when multiple SFP modules 129 are installed adjacent to each other. For example, interface card 100 may utilize heat pipe 108 to receive heat dissipated by SFP module 129 and transfer the dissipated heat to a substantially remote location (e.g., to dissipating plate 110) where the heat may be dissipated over a larger area in relation to when heat is dissipated via individual heat sinks attached to individual modules 129.

The foregoing description provides illustration and description, but is not intended to be exhaustive or to limit the possible implementations to the precise form disclosed. Modifications and variations are possible in light of the above disclosure or may be acquired from practice of the implementations.

It will be apparent that different examples of the description provided above may be implemented in many different forms of hardware in the implementations illustrated in the figures. The actual specialized control hardware used to implement these examples is not limiting of the implementations.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise.

What is claimed is:

1. A device comprising:
   a frame section having a cage with a first receiving portion and a second receiving portion,
      the second receiving portion receiving a module;
   a first plate having an end,
      the first plate being received by the first receiving portion to attach the first plate to the frame section,
      the first plate having a groove;
   a heat pipe having a first end and having a second end;
   a second plate attached to the second end of the heat pipe;
   a cover attaching the first plate, the heat pipe, and the second plate to the frame section; and
   a spring attached to the first plate and disposed between the first plate and the cover to bias the first plate against the module, the groove exposing part of the heat pipe including the first end, said exposed part of the heat pipe extending in a direction toward the second end of the heat pipe and contacting the spring, the groove having a closed portion adjacent the first end of the heat pipe and an open portion at a location spaced from the first end, such that the heat pipe extends through the open portion in the direction toward the second end, a portion of the heat pipe extending from the open portion to the second end being provided in the groove,
the first plate being capable of receiving heat dissipated by the module,
the heat pipe being capable of receiving the heat received by the first plate and transferring the heat to the second plate,
the second plate being capable of receiving the heat transferred by the heat pipe and dissipating the received heat.

2. The device of claim 1 further comprising: the module, the module being a transceiver module, a small form-factor pluggable (SFP) module, an SFP enhance (SFP+) module, a Centum form-factor pluggable (CFP) module, an CFP2 module, or a XENPACK form-factor pluggable (XFP) module,
the module having a laser, a driver, a serializer/deseralizer, a photodiode, or an amplifier.

3. The device of claim 1, where the heat pipe includes a mixture including air and water or is made from a flexible conductive material.

4. The device of claim 1, further comprising:
a first plurality of fins provided on the first plate, the first plurality of fins including a cutout portion to receive and confine the spring; and
a second plurality of fins provided on the second plate.

5. The device of claim 1, wherein the groove is a first groove, the device further comprising:
a second groove provided on the second plate to receive the second end of the heat pipe.

6. The device of claim 1, further comprising a groove provided on the second plate to receive the heat pipe.

7. The device of claim 1, further comprising:
a plurality of cages to receive respective modules, the plurality of cages including the cage;
a plurality of first plates including the first plate, each of the plurality of first plates being received by a respective one of the plurality of cages; and
a plurality of heat pipes including the heat pipe, each of the plurality of heat pipes being attached to a respective one of the plurality of first plates,
each of the plurality of first plates and each of the plurality of heat pipes being attached to the second plate.

8. A device comprising:
an interface card having:
a frame section having a cage with a first receiving portion and a second receiving portion,
the second receiving portion receiving a module;
a first plate having an end,
the first plate being received by the first receiving portion to attach the first plate to the frame section,
the first plate having a groove;
a heat pipe having a first end and having a second end;
a second plate attached to the second end of the heat pipe; and
a spring attached to the first plate to bias the first plate against the module,
the first plate being capable of receiving heat dissipated by the module, the groove exposing part of the heat pipe including the first end, said exposed part of the heat pipe extending in a direction toward the second end of the heat pipe and contacting the spring, the groove having a closed portion adjacent the first end of the heat pipe and an open portion at a location spaced from the first end, such that the heat pipe extends through the open portion in the direction toward the second end, a portion of the heat pipe extending from the open portion to the second end being provided in the groove,
the heat pipe being capable of receiving the heat received by the first plate and transferring the heat to the second plate,
the second plate being capable of receiving the heat transferred by the heat pipe and dissipating the received heat.

9. The device of claim 8, further comprising the module, the module being a transceiver module, a small form-factor pluggable (SFP) module, an SFP enhance (SFP+) module, a Centum form-factor pluggable (CFP) module, an CFP2 module, or a XENPACK form-factor pluggable (XFP) module,
the module having a laser, a driver, a serializer/deseralizer, a photodiode, or an amplifier.

10. The device of claim 8, where the heat pipe includes an air/water mixture or is made from a flexible conductive material.

11. The device of claim 8, further comprising:
a first plurality of fins provided on the first plate, the first plurality of fins including a cutout portion to receive and confine the spring; and
a second plurality of fins provided on the second plate.

12. The device of claim 8, wherein the groove is a first groove, the device further comprising:
a second groove provided on the second plate to receive the second end of the heat pipe.

13. The device of claim 8, further comprising:
a plurality of cages to receive respective modules, the plurality of cages including the cage;
a plurality of first plates including the first plate, each of the plurality of first plates being received by a respective one of the plurality of cages; and
a plurality of heat pipes including the heat pipe, each of the plurality of heat pipes being attached to a respective one of the plurality of first plates,
each of the plurality of first plates and each of the plurality of heat pipes being attached to the second plate.

14. A device comprising:
a frame section having a cage with a first receiving portion and a second receiving portion,
the second receiving portion receiving a module;
a first plate having an end,
the first plate being received by the first receiving portion to attach the first plate to the frame section,
the first plate having a groove;
a flexible heat pipe having a first end attached to the end of the first plate and having a second end, the groove exposing part of the flexible heat including the first end, said exposed part of the heat pipe extending in a direction toward the second end of the heat pipe and contacting the spring, the groove having a closed portion adjacent the first end of the heat pipe and an open portion at a location spaced from the first end, such that the heat pipe extends through the open portion in the direction toward the second end of the heat pipe, a portion of the heat pipe extending from the open portion to the second end being provided in the groove,
a second plate attached to the second end of the flexible heat pipe; and
a spring attached to the first plate to bias the first plate against the module,
the first plate being capable of receiving heat dissipated by the module, the flexible heat pipe being capable of receiving the heat received by the first plate and transferring the heat to the second plate, the second plate being capable of receiving the heat transferred by the flexible heat pipe and dissipating the received heat.

15. The device of claim 14, further comprising the module, the module being a transceiver module, a small form-factor pluggable (SFP) module, an SFP enhance (SFP+) module, a Centum form-factor pluggable (CFP) module, an CFP2 module, or a XENPACK form-factor pluggable (XFP) module, the module having a laser, a driver, a serializer/deseralizer, a photodiode, or an amplifier.

16. The device of claim 14, further comprising a cover attaching the first plate, the flexible heat pipe, and the second plate to the frame section, the spring being disposed between the first plate and the cover.

17. The device of claim 14, where the flexible heat pipe includes a mixture including air and water.

18. The device of claim 14, further comprising:

a first plurality of fins provided on the first plate, the first plurality of fins including a cutout portion to receive and confine the spring; and a second plurality of fins provided on the second plate.

19. The device of claim 14, wherein the groove is a first groove, the device further comprising:

a second groove provided on the second plate to receive the second end of the flexible heat pipe.

20. The device of claim 14, further comprising:

a plurality of cages to receive respective modules, the plurality of cages including the cage;

a plurality of first plates including the first plate, each of the plurality of first plates being received by a respective one of the plurality of cages; and a plurality of flexible heat pipes, the flexible heat pipe being one of the plurality of flexible heat pipes, each of the plurality of flexible heat pipes being attached to a respective one of the plurality of first plates, each of the plurality of first plates and each of the plurality of heat pipes being attached to the second plate.

* * * * *